(12) United States Patent
Assmann et al.

(10) Patent No.: US 8,502,532 B2
(45) Date of Patent: Aug. 6, 2013

(54) MAGNETIC RESONANCE DATA ACQUISITION SYSTEM AND METHOD WITH RECURSIVELY ADAPTED OBJECT-SPECIFIC MEASUREMENT PARAMETER ADJUSTMENT DURING PATIENT MOVEMENT THROUGH THE MRI SYSTEM

(75) Inventors: Stefan Assmann, Erlangen (DE); Okan Ekinci, Uttenreuth (DE)

(73) Assignee: Siemens Aktiengesellschaft, Munich (DE)

( * ) Notice: Subject to any disclaimer, the term of this patent is extended or adjusted under 35 U.S.C. 154(b) by 810 days.

(21) Appl. No.: 12/490,452

(22) Filed: Jun. 24, 2009

(65) Prior Publication Data
US 2009/0315561 A1    Dec. 24, 2009

(30) Foreign Application Priority Data
Jun. 24, 2008 (DE) .......................... 10 2008 029 897

(51) Int. Cl.
*G01R 33/543* (2006.01)
*G01R 33/56375* (2006.01)
*G01R 33/56383* (2006.01)

(52) U.S. Cl.
USPC ............................ 324/307; 324/309; 324/318

(58) Field of Classification Search
USPC .... 324/300–322; 600/407–435; 382/128–131
See application file for complete search history.

(56) References Cited

U.S. PATENT DOCUMENTS

| | | | | |
|---|---|---|---|---|
| 4,689,563 A * | 8/1987 | Bottomley et al. | ........... | 324/309 |
| 5,928,148 A * | 7/1999 | Wang et al. | ........... | 600/420 |
| 6,167,293 A * | 12/2000 | Chenevert et al. | ........... | 600/420 |
| 6,317,620 B1 * | 11/2001 | Ho et al. | ........... | 600/419 |
| 6,385,478 B1 * | 5/2002 | Hajnal | ........... | 600/410 |
| 6,529,762 B1 | 3/2003 | Ladebeck | | |
| 6,912,415 B2 * | 6/2005 | Kruger et al. | ........... | 600/410 |
| 6,963,768 B2 | 11/2005 | Ho et al. | | |
| 7,643,864 B2 * | 1/2010 | Elgort et al. | ........... | 600/410 |
| 7,659,720 B2 * | 2/2010 | Furudate | ........... | 324/309 |
| 7,800,368 B2 * | 9/2010 | Vaughan et al. | ........... | 324/318 |
| 7,859,261 B2 * | 12/2010 | Jattke et al. | ........... | 600/410 |
| 7,881,878 B2 * | 2/2011 | Burrus et al. | ........... | 702/28 |
| 8,191,359 B2 * | 6/2012 | White et al. | ........... | 60/407 |
| 8,330,462 B2 * | 12/2012 | Poupon et al. | ........... | 324/309 |
| 2002/0021128 A1 * | 2/2002 | Kuhara | ........... | 324/309 |
| 2002/0115929 A1 * | 8/2002 | Machida | ........... | 600/410 |
| 2002/0140423 A1 * | 10/2002 | Brittain | ........... | 324/301 |
| 2002/0173715 A1 * | 11/2002 | Kruger et al. | ........... | 600/410 |
| 2003/0011369 A1 * | 1/2003 | Brittain et al. | ........... | 324/309 |
| 2005/0054910 A1 * | 3/2005 | Tremblay et al. | ........... | 600/411 |
| 2006/0229856 A1 * | 10/2006 | Burrus et al. | ........... | 703/11 |
| 2007/0253599 A1 * | 11/2007 | White et al. | ........... | 382/107 |

(Continued)

OTHER PUBLICATIONS

"A Real-Time 3D Large Field-of-View MRI System with Interactive Table Motion," Sabati et al, Concepts in Magnetic Resonance, Part B, vol. 29B (1), 2006, pp. 28-41.

*Primary Examiner* — Patrick Assouad
*Assistant Examiner* — Tiffany Fetzner
(74) *Attorney, Agent, or Firm* — Schiff Hardin LLP

(57) ABSTRACT

In a method and a magnetic resonance (MR) system for acquisition of MR data of a measurement subject in an MR examination in the magnetic resonance system, MR data of the measurement subject (are acquired according to measurement parameters while the measurement subject is moved relative to the magnetic resonance system, the acquired MR data are analyzed, and the measurement parameters are automatically adapted.

22 Claims, 2 Drawing Sheets

U.S. PATENT DOCUMENTS

| | | | |
|---|---|---|---|
| 2008/0129298 A1* | 6/2008 | Vaughan et al. | 324/322 |
| 2008/0180104 A1* | 7/2008 | Furudate | 324/318 |
| 2008/0231275 A1* | 9/2008 | Jattke et al. | 324/309 |
| 2009/0010517 A1* | 1/2009 | Basser et al. | 382/131 |
| 2009/0315561 A1* | 12/2009 | Assmann et al. | 324/309 |
| 2010/0066366 A1* | 3/2010 | Cochrane et al. | 324/310 |
| 2010/0308821 A1* | 12/2010 | Poupon et al. | 324/309 |
| 2011/0044524 A1* | 2/2011 | Wang et al. | 382/131 |

* cited by examiner

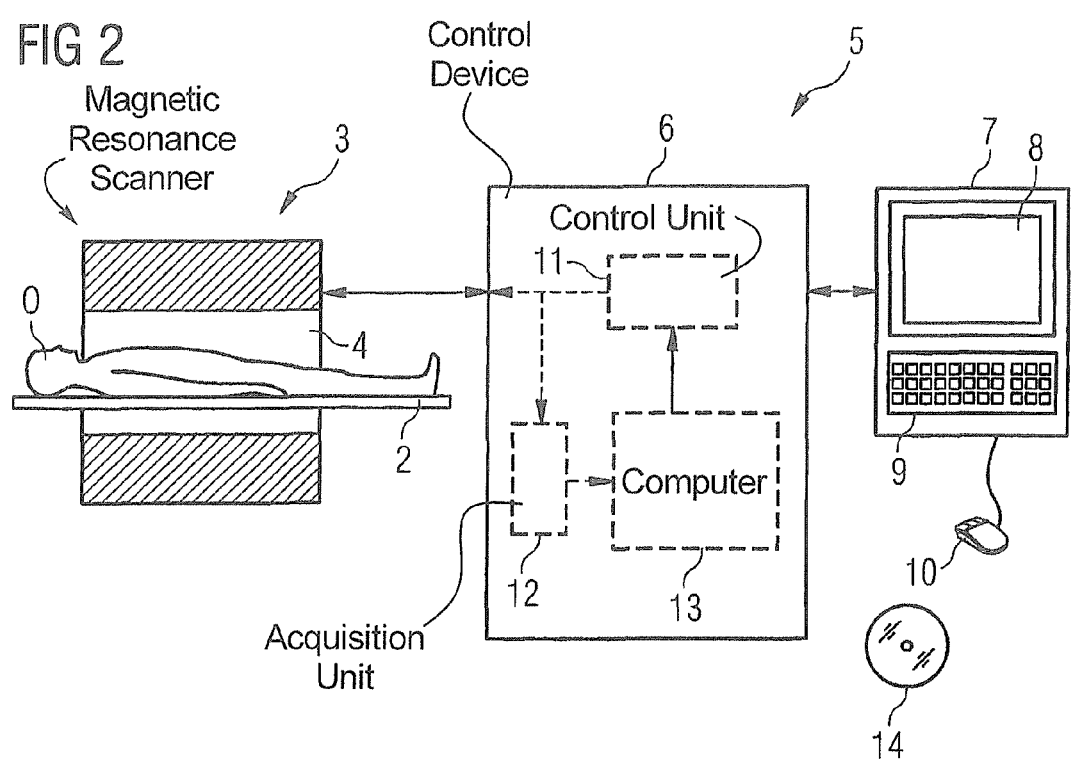

MAGNETIC RESONANCE DATA ACQUISITION SYSTEM AND METHOD WITH RECURSIVELY ADAPTED OBJECT-SPECIFIC MEASUREMENT PARAMETER ADJUSTMENT DURING PATIENT MOVEMENT THROUGH THE MRI SYSTEM

BACKGROUND OF THE INVENTION

1. Field of the Invention

The present invention concerns a method to improve an acquisition of MR data of a measurement subject in an MR examination in a magnetic resonance system wherein, during the MR examination, the measurement subject is moved relative to a magnetic field generated by the magnetic resonance system, as well as a correspondingly designed magnetic resonance system.

2. Description of the Prior Art

With modern technologies it is presently possible to subject a patient to an MR examination from head to foot in a magnetic resonance system, as in computed tomography. The table of the magnetic resonance system is thereby moved through the measurement field in the magnet during the MR examination.

In such an MR examination, in which the table is moved relative to the magnet or relative to the magnetic field during the MR examination, different body regions of the patient are examined or imaged. In conventional systems, it is difficult or nearly impossible to adjust measurement parameters that indicate how (i.e., with which MR protocol or with which MR sequence) the MR examination should ensue in order to make the examination or the imaging of the different body regions optimal for each of these body regions.

SUMMARY OF THE INVENTION

It is an object of the present invention to provide a method and a device for acquisition of MR data of a measurement subject, whereby the problems according to the prior art that are described above are at least ameliorated (if not erased entirely).

This object is achieved in accordance with the present invention by a method for acquisition of MR data of a measurement subject in an MR examination in a magnetic resonance system wherein MR data of the measurement subject are acquired using measurement parameters, with the measurement subject being moved relative to the magnetic resonance system during the data acquisition, with the switching sequence of the gradients and RF pulses that is necessary for the MR examination being generated depending on the measurement parameters, and the MR data are acquired depending on the measurement parameters, and wherein the acquired MR data are analyzed, in particular specific objects can be searched for and detected using the MR data in the measurement subject, for example specific organs, and the measurement parameters are correspondingly adapted depending on the analyzed MR data, i.e. depending on a result of the preceding analysis.

The method according to the invention operates recursively, which means that additional MR data of the measurement subject are acquired with the adapted measurement parameters, which additional MR data are in turn analyzed, and the measurement parameters are adapted in turn depending on this analysis, etc., in order to produce object-specific measurement parameters.

Different regions of the measurement subject (for example different body regions of a person) are advantageously examined with different measurement parameters in the method according to the invention. Each region can be examined or shown with those measurement parameters that are optimal for the corresponding region. Expressed otherwise, the method according to the invention analyzes the "measurement front" and provides the result to the measurement unit, so the measurement parameters can be automatically varied as necessary during the table feed. The workflow for the user or the operator of the magnetic resonance system is thereby significantly simplified since the workflow is additionally automated, at least to a certain extent.

Through the method according to the invention, the duration of the MR examination is also shortened in comparison to the prior art, which is also advantageous for the patient since the patient's residence time in the magnetic resonance system is shortened. This is due to the fact that, according to the prior art, at least certain portions of the MR examination must be repeated if it is established upon evaluation of the image data that different measurement parameters (for example a higher resolution) would have been more suitable for a specific body region.

The measurement subject can be moved continuously relative to the magnet or relative to the magnetic field during the MR examination, i.e. while the MR data are acquired. It is also possible for the movement of the measurement subject to not ensue continuously during the MR examination, but rather in steps.

The measurement parameters encompass all variable (settable) values within an MR protocol or within an MR sequence, as well as even the MR protocol or the MR sequence itself. Examples of measurement parameters are T1-TSE (T1-weighted Turbo Spin Echo sequence), T2-TSE (T2-weighted Turbo Spin Echo sequence) and TrueFISP (True Fast Imaging with Steady-state Precession).

Moreover, the following measurement parameters can be adapted via the present invention:

The resolution with which pixels are determined within a volume to be examined within the measurement subject.

A slice thickness that indicates how thick respective slices that are examined in succession in the MR examination in order to examine or to image a volume segment within the measurement subject.

The phase coding direction, which indicates the direction of a magnetic field gradient in order to generate, via this magnetic field gradient, different spin phases along the phase coding direction in order to thereby enable in turn a spatial localization of the acquired MR data.

A readout direction, which indicates a direction of a readout magnetic field gradient which is activated upon readout of the MR data.

A repetition time (TR), which indicates after what time period a pulse is generated again, for example.

An echo time (TE), which indicates after what time period a corresponding echo signal occurs after an application of, for example, a 90° pulse.

A tilt angle or flip angle, which indicates the angle that is formed between the primary magnetization direction and the primary magnetic field.

The use of a fat suppression, whereby signals of adipose tissue are suppressed within the acquired MR data. This measurement parameter indicates whether and how the fat suppression is implemented.

The use of a water excitation in order to generate optimally strong signals generated by water in the determination of the MR data. This measurement parameter indicates whether and how the water excitation is implemented.

A partial Fourier factor. Among other things, the geometry of the raw data within k-space is utilized with the partial Fourier transformation. The partial Fourier factor indicates what percentage of the raw data within k-space is used to generate the MR data.

The use of parallel image acquisition techniques to accelerate the determination of the MR data, for example in that the MR data are acquired in parallel or simultaneously via multiple acquisition devices (most often coils). This measurement parameter, which can also be called the acceleration factor, indicates whether and which parallel image acquisition technique is used.

The use of techniques to acquire and correct movements within the volume to be examined during the MR examination, which is also known as a navigator. For example, if the volume to be examined is located in proximity to a moving organ (for example the lungs or the heart), or if the volume to be examined comprises the moving organ, a movement of this organ is detected, for example, and the acquisition of the MR data that is disrupted by the movement is correspondingly corrected. This measurement parameter indicates whether and which a specialized technique is used to acquire and correct movements, and which technique to use.

The bandwidth of frequencies of signals that are read out to acquire the MR data. This bandwidth indicates the interval between the smallest and the highest frequency of a signal to be read out to acquire the MR data.

As was stated briefly above, the analysis of the MR data can also include detection of objects in the measurement subject in order to adapt the measurement parameters depending on the currently detected object. Both the currently acquired MR data and previously acquired MR data can be used to detect the objects.

The detection of the objects can ensue using a segmentation method, which normally recognizes edges within an image generated via the MR data and thereby determines one or more objects within the this image using the edges. Objects are segmented and detected with such a method. The detection of the objects also can ensue using a method for searching for an item known as a landmark, which method searches for predefined landmarks (for example predefined shapes or patterns) within the image and thereby determines one or more objects in the image. Naturally, the detection of objects according to the invention can also ensue by means of methods that implement an object detection through an analysis of the raw data acquired during the MR examination. Moreover, according to the invention it is possible for the detection of objects to be conducted using multiple methods or algorithms.

The adaptation of the measurement parameters can ensue according to the invention depending on a currently detected object, in order to optimize the imaging of this object. However, according to the invention it is likewise possible for the adaptation of the measurement parameters to ensue depending on an object which is arranged after the currently detected object in the movement direction of the table through the magnetic resonance system. For this purpose, knowledge is required as to which object (or which type of object) is located after the currently detected object in the movement direction. If the measurement subject is an organism, the method according to the invention can take into account the anatomy of this organism in order to determine, via the anatomy, the object that is arranged directly after the currently detected object in the movement direction of the measurement subject, so that the measurement parameters can be adapted to this subsequent object in order to advantageously optimize an imaging of this object which ensues using MR data that are still to be acquired. If, according to the information present to the method according to the invention, multiple objects are arranged directly after the currently detected object in the movement direction, the densest object feature located at the currently detected object, or the object that has the greatest weighting (according to a predetermined prioritization) can be used to determine the measurement parameter.

The adaptation of the measurement parameters to the currently detected object or the object situated after the currently detected object can ensue such that specific measurement parameters are predetermined in advance for each object type, these specific measurement parameters then accordingly being set for the acquisition of the additional or following MR data.

A specification of which measurement parameters should be used with which object type (for example which measurement parameters should be used with which organ) advantageously need be conducted only once, and can be used for arbitrarily many MR examinations. The method according to the invention automatically detects which organ is presently situated in the measurement field (volume segment from which the MR data are currently acquired), or which organ will next be situated in the measurement field due to the movement of the measurement subject in the movement direction, and the method automatically appropriately adapts the measurement parameters.

If the anatomy of a person (or another organism) is known to the processor implementing the method according to the invention, and the optimal measurement parameters for each organ or for each body structure are predetermined during an MR examination, the processor implementing the method according to the invention "knows" where the measurement front is presently anatomically located and can then accordingly automatically change the measurement parameters during the table feed, corresponding to the specification.

The adaptation of the measurement parameters depending on the currently detected object or depending on the object directly following the currently detected object can be explained using the following three exemplary embodiments.

If, for example, the method according to the invention detects a vessel in the MR examination, a resolution with which pixels within a volume to be examined within the measurement subject are determined can be adapted to the vessel, such that the resolution measurement parameter is set to be higher the smaller the vessel. Expressed otherwise, for example, given a peripheral angio measurement proceeding from the kidneys to the feet, with the method according to the invention a vessel-sensitive algorithm would detect when the measurement front or the measurement field has reached the bifurcation of the aorta in the iliac vessels (or the trifurcation of the femoral artery) and then correspondingly causes the resolution to be changed if this is desired (for example to select a higher resolution when the vessel diameter becomes smaller).

In an additional embodiment according to the invention, if a bone structure is detected as an object in the measurement subject, the resolution measurement parameter is set to be higher the finer or the smaller the bone structure, or the finer or the smaller the specific segments of the bone structure. For example, given musculo-skeletal acquisitions of an arm or a leg, the resolution would be automatically increased in the direction of the hand or the foot.

In these two embodiments, the adaptation of the measurement parameter ensues depending on the currently detected object. In contrast to this, in the following embodiment the adaptation of the measurement parameter ensues depending on the object following the currently detected object.

In this third embodiment, the movement direction with which the measurement subject is directed through the magnetic resonance system is predetermined such that MR data of the lungs are acquired first and subsequently MR data of the liver are acquired. When a demarcation of the lung in the region of the liver (for example the diaphragm or the lung-diaphragm boundary) is detected as an object in the measurement subject in the MR examination, upon a transition (due to continued movement of the patient) to the liver, the measurement parameters are left unchanged with regard to a use of a fat suppression to suppress signals caused by adipose tissue in the determination of the MR data, and with regard to a use of a water excitation for preferred generation of signals caused by water in the determination of the MR data. In other words, according to the invention the measurement parameters with regard to the fat suppression and the water excitation are not changed (i.e. these measurement parameters remain as they were set for the lungs) if, using the current MR data, it is detected that a transition from the lungs to the liver occurs next. The other measurement parameters can be set as is provided for a liver in order to thereby optimize the imaging of the liver (for example), which ensues using the subsequently acquired MR data.

Naturally, in a modification of the third embodiment it is also possible for the movement direction to be predetermined such that MR data of the liver are acquired first and MR data of the lungs are acquired subsequently. The measurement parameters with regard to the fat suppression and with regard to the water excitation are then left unchanged given a transition to the lungs as soon as a boundary of the liver in proximity to the lungs is detected as an object in the measurement subject in the MR examination.

The present invention also encompasses a magnetic resonance system operable to acquire MR data of a measurement subject in an MR examination in the magnetic resonance system. The magnetic resonance system has a table that accommodates the measurement subject during the MR examination, an acquisition unit that acquires the MR data of the measurement subject; and a computer that sets the measurement parameters used to implement the MR examination by the magnetic resonance system. The magnetic resonance system is designed such that, given the acquisition of the MR data a control unit moves the table relative to a magnetic field is generated by the magnetic resonance system. The computer analyzes the acquired MR data and adapts the measurement parameters depending on this analysis.

The advantages of the magnetic resonance system according to the invention essentially correspond to the advantages of the method according to the invention.

The present invention also encompassed an electronically-readable data medium (for example a DVD) on which electronically-readable control information (in particular software) is stored. All embodiments of the method according to the invention that are described in the preceding can be implemented when this control information is read from the data medium and stored in a controller or computer of a magnetic resonance system.

The present invention is particularly suitable for use in a magnetic resonance system when, during the MR examination, the table of the magnetic resonance system moves relative to the magnet of the magnetic resonance system or relative to the magnetic field generated by the magnetic resonance system. Naturally, the present invention is not limited to this preferred application field but also can be used in magnetic resonance systems if the table is not moved relative to the magnet or relative to the magnetic field. For example, in this regard it is conceivable that, after the automatic adaptation of the measurement parameters depending on the analyzed MR data, MR data of the same volume segment are now acquired again but with the optimized measurement parameters.

BRIEF DESCRIPTION OF THE DRAWINGS

FIG. 2 is a schematic representation of a magnetic resonance system according to the invention, with connected terminal and a DVD with software according to the invention.

DESCRIPTION OF THE PREFERRED EMBODIMENTS

Figure 1:
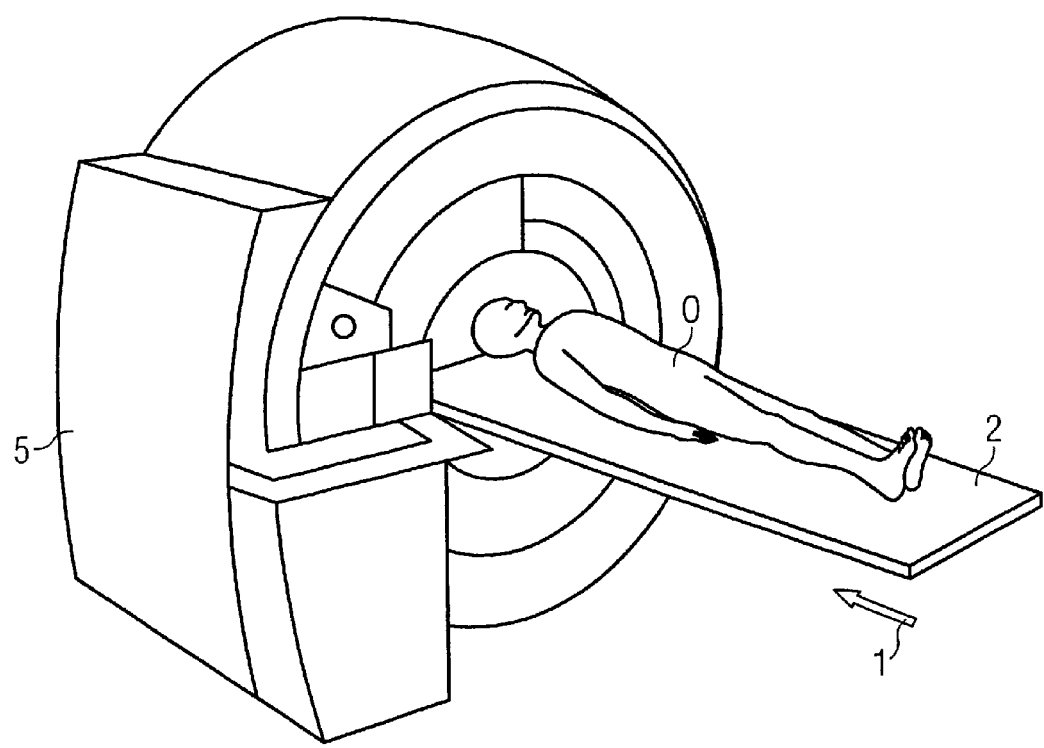
FIG. 1 is a schematic, perspective representation of a magnetic resonance system according to the invention.

A magnetic resonance system 5 according to the invention is shown in FIG. 1, wherein a patient O who lies on a table 2 is moved continuously all the way through the magnetic resonance system 5 in a movement direction 1 during an MR examination with said magnetic resonance system 5. The patient is thereby examined or scanned essentially from head to toe in only one pass so that a seamless scan of the entire body of the patient can be created. Naturally, it is likewise possible to examine only one specific segment of the patient (for example only the upper body) according to the present invention by only the segment of interest is being moved through the magnetic field of the magnetic resonance system 5.

The magnetic resonance system 5 according to the invention is schematically shown in more detail in FIG. 2. The magnetic resonance system 5 essentially has a scanner 3 with which the magnetic field necessary for the MR examination is generated in a measurement volume 4; a table 2, a control device 6 with which the scanner 3 is controlled and MR data are acquired from the scanner 3, and a terminal 7 connected to the control device 6.

The control device 6 includes a control unit 11, an acquisition unit 12 and a computer 13. During an MR examination, MR data are acquired by the acquisition unit 12 by means of the tomograph 3 and are relayed to the computer 13 for additional evaluation. The computer 13 analyzes the MR data in that it in particular searches for known objects (for example organs or known body structures). If the computer 13 detects a corresponding object, the computer 13 determines (depending on this object) the measurement parameters for the additional MR examination and relays these measurement parameters to the control unit 11. The control unit 11 translates these measurement parameters (which can even comprise entire MR protocols or MR sequences) into a form intelligible to the scanner 3 and sends corresponding control commands to the scanner 3 in order to acquire additional MR data via the scanner 3 according to the now-adapted measurement parameters. These new MR data are in turn analyzed by the computer 13, and the measurement parameters are adapted as necessary to the analysis results, which are also created again with the new MR data. This cycle (acquisition of the MR data; analysis of the MR data; and adaptation of the measurement parameters corresponding to the analysis) is continued until the MR examination is terminated.

It is should be noted that not only the present, freshly acquired MR data but also all MR data previously acquired during the MR examination can be analyzed in the analysis of the MR data.

In addition to the analysis of the MR data in order to adapt the measurement parameters, the computer 13 also operates on the MR data such that an image of specific body segments of the patient O can be shown on a screen 8 of the terminal 7. In addition to the depiction of such images, which organ or which body structure should be measured with which measurement parameter set can be predetermined by a user with the terminal 7 (which has a keyboard 9 and a mouse 10 in addition to the screen 8). This specification can be input manually or can be made known to the magnetic resonance system 5 with the use of data media (for example a DVD 14).

The software for the control device 6 can also be loaded into the control device 6 (in particular into the computer 13) via the terminal 7. This software of the control device 6 include programming instructions to implement the method according to the invention for acquisition of MR data of a measurement subject, and can likewise be stored on a DVD 14, such that this software can then be read by the terminal 7 from the DVD 14 and copied into the control device 6.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for acquiring of acquiring magnetic resonance data from a subject comprising:
   moving at least a segment of a subject through a magnetic resonance data acquisition unit;
   acquiring magnetic resonance data from at least said segment of the subject in the magnetic resonance data acquisition unit while said segment of the subject is moving through the magnetic resonance data acquisition unit, using measurement parameters;
   in a processor, automatically analyzing recursively the acquired magnetic resonance data while the segment of the subject is still moving through the magnetic resonance data acquisition unit in order to identify at least one object in the subject; and
   while the segment of the subject is still moving through the magnetic resonance data acquisition unit, automatically recursively adapting said measurement parameters dependent on the analyzed magnetic resonance data in order to produce object-specific measurement parameters that are optimized in order to acquire magnetic resonance data from said object, and then acquiring further said at least one object in order to produce object-specific measurement parameters that are optimized in order to acquire magnetic resonance data from said object situated after said at least one object; and
   while the segment of the subject is still moving through the magnetic resonance data acquisition unit, operate said data acquisition unit in order to acquire magnetic resonance data at least from said segment of said subject using said produced object-specific measurement parameters.

2. A method as claimed in claim 1 comprising continuously moving the subject through the magnetic resonance data acquisition unit.

3. A method as claimed in claim 1 comprising selecting said measurement parameters from the group consisting of a magnetic resonance protocol, a magnetic resonance sequence, variable values within a magnetic resonance protocol, and variable values within a magnetic resonance sequence.

4. A method as claimed in claim 1 comprising selecting said measurement parameters from the group consisting of a resolution of said magnetic resonance data, a slice thickness of the subject from which the magnetic resonance data are acquired, a phase coding direction with which the magnetic resonance data are acquired, a readout direction with which the magnetic resonance data are acquired, a repetition time with which the magnetic resonance data are acquired, an echo time with which the magnetic resonance data are acquired, a flip angle with which the magnetic resonance data are acquired, use of fat suppression to suppress magnetic resonance signals caused by fat tissue when acquiring said magnetic resonance data, use of water excitation for preferred generation of signals caused by water in the subject when acquiring said magnetic resonance data, a partial Fourier factor for reconstructing an image from said magnetic resonance data, use of a parallel image acquisition technique to accelerate acquisition of said magnetic resonance data, use of techniques to determine and correct movement of the subject within a volume from which the magnetic resonance are acquired, a re-ordering technique to enter said magnetic resonance data into k-space, and a bandwidth of frequencies of signals that are read out from the subject to acquire the magnetic resonance data.

5. A method as claimed in claim 1 comprising:
   in said processor, detecting said at least one object by a technique selected from the group consisting of computerized segmentation and algorithmic searching for an anatomical landmark.

6. A method as claimed in claim 1 comprising:
   in a memory accessible by said processor, storing different object type-specific measurement parameters that are respectively optimized for acquiring magnetic resonance data from different object types;
   in said processor, automatically determining an object type of said at least one object; and
   adapting said measurement parameters by accessing the object type-specific measurement parameters stored in said memory for the object type of the at least one object, and using said object type-specific parameters as said object-specific parameters to acquire said magnetic resonance data at least from said segment.

7. A method as claimed in claim 1 comprising detecting a vessel in the subject as said at least one object, and adapting a resolution of magnetic resonance image data by employing a higher resolution as a size of said vessel becomes smaller.

8. A method as claimed in claim 1 comprising detecting a bone structure as said at least one object in the subject, and adapting a resolution of magnetic resonance image data to said bone structure to cause said resolution to be higher as said bone structure becomes finer or smaller.

9. A method to acquire magnetic resonance data from a subject comprising:
   moving at least a segment of a subject through a magnetic resonance data acquisition unit;
   acquiring magnetic resonance data from at least said segment of the subject in the magnetic resonance data acquisition unit while said segment of the subject is moving through the magnetic resonance data acquisition unit, using measurement parameters;
   in a processor, automatically analyzing the acquired magnetic resonance data while the segment of the subject is still moving through the magnetic resonance data acquisition unit in order to identify at least one object in the subject;
   in said processor, determining another object, dependent on the anatomy of the subject, that follows said at least one object due to said movement of said subject through the magnetic resonance data acquisition unit; and while the segment of the subject is still moving through the magnetic resonance data acquisition unit, automatically adapting said measurement parameters dependent on the analyzed magnetic resonance data in order to produce object-specific measurement parameters that are optimized for acquiring magnetic resonance data from said object that follows said at least one object; and while the segment of the subject is still moving through the magnetic resonance data acquisition unit, using said object-specific measurement parameters in order to acquire magnetic resonance data from said object that follows said at least one object.

10. A method as claimed in claim 9 comprising:

in a memory accessible by said processor, storing different object-specific measurement parameters that are respectively optimized for acquiring magnetic resonance data from different object types;

in said processor, identifying an object type of the object situated after said at least one object; and adapting the measurement parameters for acquiring magnetic resonance data for said object that follows said at least one object by accessing the specific measurement parameter set stored in said memory for the object type of the object that follows the at least one object, and using said object type-specific parameters as said object-specific parameters in order to acquire magnetic resonance data from said object that follows said at least one object.

11. A magnetic resonance system to acquire magnetic resonance data from a subject comprising:

a magnetic resonance data acquisition unit;

a patient bed operable to move at least a segment of a subject through the magnetic resonance data acquisition unit;

a control unit configured to operate said magnetic resonance data acquisition unit in order to acquire magnetic resonance data from at least said segment of the subject in the magnetic resonance data acquisition unit while said segment of the subject is moving through the magnetic resonance data acquisition unit, using measurement parameters;

said control unit being configured to automatically analyze the acquired magnetic resonance data while the segment of the subject is still moving through the magnetic resonance data acquisition unit to identify at least one object in the subject;

said control unit being configured to determine, dependent on the anatomy of the subject, an object that follows said at least one object in the subject due to said movement of the subject through the magnetic resonance data acquisition unit; and said control unit being configured to automatically adapt said measurement parameters dependent on the analyzed magnetic resonance data, while the segment of the subject is still moving through the magnetic resonance data acquisition unit, in order to produce object-specific measurement parameters that are optimized for acquiring magnetic resonance data from said object that follows said at least one object in said subject, and to acquire further magnetic resonance data at least from said segment of the subject using said object-specific measurement parameters, while the segment of the subject is still moving through the magnetic resonance data acquisition unit.

12. A magnetic resonance system as claimed in claim 11 comprising:

a memory accessible by said control unit, in which different specific measurement parameters that are respectively optimized for acquiring magnetic resonance data from object types are stored; and said control unit being configured to identify an object type of the object situated after said at least one object, and to adapt the measurement parameters for acquiring magnetic resonance data for said object that follows said at least one object by accessing the specific measurement parameter set stored in said memory for the object type of the object that follows the at least one object, and to use said object type-specific parameters as said object-specific parameters in order to acquire magnetic resonance data from said object that follows said at least one object.

13. A magnetic resonance system to acquire magnetic resonance data from a subject comprising:

a magnetic resonance data acquisition unit;

a patient bed operable to move at least a segment of a subject through the magnetic resonance data acquisition unit;

a control unit configured to operate said magnetic resonance data acquisition unit in order to acquire magnetic resonance data from at least said segment of the subject in the magnetic resonance data acquisition unit while said segment of the subject is moving through the magnetic resonance data acquisition unit, using measurement parameters;

said control unit being configured to automatically analyze the acquired magnetic resonance data while the segment of the subject is still moving through the magnetic resonance data acquisition unit in order to identify at least one object in the subject; and said control unit being configured to automatically adapt said measurement parameters dependent on the analyzed magnetic resonance data while the segment of the subject is still moving through the magnetic resonance data acquisition unit, in order to produce object-specific measurement parameters that are optimized for acquiring magnetic resonance data from said object, and to operate said magnetic resonance data acquisition unit in order to acquire further magnetic resonance data at least from said segment of the subject using the object-specific measurement parameters while the segment of the subject is still moving through the magnetic resonance data acquisition unit.

14. A magnetic resonance system as claimed in claim 13 wherein said patient bed is configured to continuously move the subject through the magnetic resonance data acquisition unit.

15. A magnetic resonance system as claimed in claim 13 wherein said control unit is configured to employ measurement parameters selected from the group consisting of a magnetic resonance protocol, a magnetic resonance sequence, variable values within a magnetic resonance protocol, and variable values within a magnetic resonance sequence.

16. A magnetic resonance system as claimed in claim 13 wherein said control unit is configured to employ measurement parameters selected from the group consisting of a resolution of said magnetic resonance data, a slice thickness of the subject from which the magnetic resonance data are acquired, a phase coding direction with which the magnetic resonance data are acquired, a readout direction with which the magnetic resonance data are acquired, a repetition time with which the magnetic resonance data are acquired, an echo time with which the magnetic resonance data are acquired, a flip angle with which the magnetic resonance data are acquired, use of fat suppression to suppress magnetic resonance signals caused by fat tissue when acquiring said magnetic resonance data, use of water excitation for preferred generation of signals caused by water in the subject when acquiring said magnetic resonance data, a partial Fourier factor for reconstructing an image from said magnetic resonance data, use of a parallel image acquisition technique to accelerate acquisition of said magnetic resonance data, use of techniques to determine and correct movement of the subject within a volume from which the magnetic resonance are acquired, a re-ordering technique to enter said magnetic resonance data into k-space, and a bandwidth of frequencies of signals that are read out from the subject to acquire the magnetic resonance data.

17. A magnetic resonance system as claimed in claim 13 wherein said control unit is configured to detect a vessel in the subject as said at least one object, and to adapt a resolution of magnetic resonance image data by employing a higher resolution as a size of said vessel becomes smaller.

18. A magnetic resonance system as claimed in claim 13 wherein said control unit is configured to detect said at least one object by a technique selected from the group consisting of computerized segmentation and algorithmic searching for an anatomical landmark.

19. A magnetic resonance system as claimed in claim 13 wherein said control unit is configured to detect a bone structure as said at least one object, and to adapt a resolution of magnetic resonance image data to said bone structure to cause said resolution to be higher as said bone structure becomes finer or smaller.

20. A magnetic resonance system as claimed in claim 13 comprising:
a memory accessible by said control unit, in which different specific measurement parameters that are respectively optimized for acquiring magnetic resonance data from different object types are stored; and
wherein said control unit is configured to automatically determine an object type of said at least one object, and to adapt said measurement parameters by accessing the specific measurement parameters stored in said memory for the object type of the at least one object, and to use said object type-specific parameters as said object-specific parameters in order to acquire said further magnetic resonance data at least from said segment.

21. A non-transitory computer-readable storage medium encoded with programming instructions, said storage medium being loaded into a controller of a magnetic resonance system having a patient bed and a magnetic resonance data acquisition unit, and said programming instructions causing said magnetic resonance system to be operated by said controller to:
move at least a segment of a subject on the patient bed through the magnetic resonance data acquisition unit;
acquire magnetic resonance data from at least said segment of the subject in the magnetic resonance data acquisition unit while said segment of the subject is moving through the magnetic resonance data acquisition unit, using measurement parameters;
automatically analyze the acquired magnetic resonance data while the segment of the subject is still moving through the magnetic resonance data acquisition unit to identify at least one object in the subject; and
automatically adapt said measurement parameters dependent on the analyzed magnetic resonance data, while the segment of the subject is still moving through the magnetic resonance data acquisition unit, in order to produce object-specific measurement parameters that are optimized for acquiring magnetic resonance data from said object, and acquire further magnetic resonance data at least from said segment of the subject using the object-specific measurement parameters while the segment of the subject is still moving through the magnetic resonance data acquisition unit.

22. A non-transitory computer-readable storage medium encoded with programming instructions, said storage medium being loaded into a controller of a magnetic resonance system having a patient bed and a magnetic resonance data acquisition unit, and said programming instructions causing said magnetic resonance system to be operated by said controller to:
move at least a segment of a subject on the patient bed through the magnetic resonance data acquisition unit;
acquire magnetic resonance data from at least said segment of the subject in the magnetic resonance data acquisition unit while said segment of the subject is moving through the magnetic resonance data acquisition unit, using measurement parameters;
automatically analyze the acquired magnetic resonance data while the segment of the subject is still moving through the magnetic resonance data acquisition unit to identify at least one object in the subject;
determine an object, dependent on the anatomy of the subject, that follows said at least one object in the subject due to said movement of the subject through the magnetic resonance data acquisition unit;
while the segment of the subject is still moving through the magnetic resonance data acquisition unit, adapt the measurement parameters in order to acquire magnetic resonance data from said object that follows said at least one object in order to produce object-specific measurement parameters that are optimized for acquiring magnetic resonance data from said object that follows said at least one object; and
while the segment of the subject is still moving through the magnetic resonance data acquisition unit, operate said data acquisition unit in order to acquire magnetic resonance data at least from said segment of said subject using said object-specific measurement parameters.

* * * * *